United States Patent
Hsu et al.

(10) Patent No.: US 7,211,886 B2
(45) Date of Patent: May 1, 2007

(54) THREE-DIMENSIONAL MULTICHIP STACK ELECTRONIC PACKAGE STRUCTURE

(75) Inventors: Yung-Yu Hsu, Hsinchu (TW); Kuo-Ning Chiang, Yangmei Township, Taoyuan County (TW); Chang-An Yuan, Kaohsiung (TW); Chang-Chun Lee, Longtan Township, Taoyuan County (TW); Hsien-Chie Cheng, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/437,718

(22) Filed: May 22, 2006

(65) Prior Publication Data

US 2006/0273439 A1 Dec. 7, 2006

Related U.S. Application Data

(62) Division of application No. 10/957,653, filed on Oct. 5, 2004, now abandoned.

(30) Foreign Application Priority Data

Apr. 1, 2004 (TW) ............................... 93109070 A

(51) Int. Cl.
H01L 23/02 (2006.01)
(52) U.S. Cl. ................ 257/686; 257/697; 257/E23.048
(58) Field of Classification Search .................... None
See application file for complete search history.

(56) References Cited

U.S. PATENT DOCUMENTS

| 5,448,511 A | 9/1995 | Paurus et al. .................. 365/52 |
| 5,789,815 A | 8/1998 | Tessier et al. ............... 257/723 |
| 2004/0094831 A1 | 5/2004 | Aoyagi ....................... 257/678 |

*Primary Examiner*—Minhloan Tran
*Assistant Examiner*—Leslie Pilar Cruz
(74) *Attorney, Agent, or Firm*—Bacon & Thomas, PLLC

(57) ABSTRACT

The present invention relates to a three-dimensional multi-chip stack electronic package structure and method for making the same, including a main substrate having at least a pin-hole set and at least a flexible substrate having at least a pin terminal. At least an electronic device including an active component and a passive component is attached to the flexible substrate by adhesion. In the flexible substrate, electric signals of the electronic device are delivered to the pin terminal through at least a conductive wire for transmitting electric signals. In assembly, the pin terminal of the flexible substrate is inserted into the pin hole of the main substrate. Then, the flexible substrate is folded so as to package the electronic device in a three-dimensional multi-chip stack manner.

2 Claims, 10 Drawing Sheets

THREE-DIMENSIONAL MULTICHIP STACK ELECTRONIC PACKAGE STRUCTURE

This application is a divisional application of U.S. application Ser. No. 10/957,653, filed Oct. 5, 2004 now abandoned (of which the entire disclosure of the pending, prior application is hereby incorporated by reference).

BACKGROUND OF THE INVENTION

1. Field of the Invention

The present invention relates to an electronic package structure and method for making the same. More particularly, the present invention relates to a three-dimensional stack electronic package structure and method for making the same by using a flexible substrate.

2. Description of Related Art

In recent years, demands for high-speed and large-capacity electronic products have significantly increased, and correspondingly, fabrication difficulties have increased too. Taking the memory among the electronic products as an example, the fabrication process has gradually become increasingly difficult as it developed from the early 4M, 16M and 64M to the contemporary 128M DDR or 256M DDR. Correspondingly, the chip yield of a single-die memory chip having large capacity is decreased. Hence, the large capacity memory can be achieved by improving the package fashion. For example, a 256M memory can be obtained by packaging two 128M chips in a three-dimensional stack manner. Not only can the complexity of the wafer fabricating process be significantly reduced but also the fabrication cost can be greatly reduced by the three-dimensional stack package.

In a common prior art, a single chip is packaged basically in accordance with a single-chip micro ball grid array as shown in FIGS. 1a and 1b. In the single-chip micro ball grid array, a main substrate 100 has a plurality of chips 150 mounted thereon. Also, the chip 150 has a plurality of fastening structures 170 so that electric signals from the chips are delivered to the main substrate 100 through the fastening structures 170 by weld joint, glue joint, hot joining or a combination thereof. If an increase of the capacity of the entire memory on the substrate is desired so as to result in a multichip micro electronic package structure having a plurality of units, more costs or more complex semiconductor chip fabricating technology will be involved. Oppositely, if the multichip package is used, it will merely require the lower-cost and matured semiconductor fabricating technology to obtain the higher yield. Furthermore, the memory capacity is increased to at least double to meet with the market demands.

In the multichip package, there are mainly plane/side-by-side juxtaposed multichip packages and stacked multichip packages. The plane/side-by-side juxtaposed multichip package using two or more than two juxtaposed chips is exemplified by U.S. Pat. No. 5,352,632, entitled "Multichip packaged semiconductor device and method for manufacturing the same", which disclosed a connection of metal lead patterns between chips supported by a flexible resin tape to be sealed into a resin package. The tape adheres to the meal leads projecting from the package for being used in the known surface mount technology. In addition, U.S. Pat. No. 5,373,188, entitled "Packaged semiconductor device including multiple semiconductor chips and cross-over lead", disclosed chips of different types connected to bonding pads of a chip of a lead frame, in which input/output terminals are wire bonded to inner leads of the lead frame. Furthermore, the leads are used above or below a semiconductor chip for connection to electrodes that are unable to be reached by cross-over leads. Finally, this assembly is encapsulated in a plastic package, resulting in a large-sized final product. The aforesaid two patents use the resin package to encapsulate multiple chips. Thus, it is difficult to rework a single damaged chip in the multichip package by replacement with an effective chip, and the entire multichip package has to be discarded. Hence, such packaging styles significantly increase fabrication cost.

In the multichip stack package, U.S. Pat. No. 4,862,322, entitled "Double electronic device structure having beam leads solderlessly bonded between contact locations on each device and projecting outwardly from therebetween", disclosed a structure composed of two chips facing each other in which input/output terminals are connected by means of beam leads. Even so, the costs of the material, fabrication and control as associated with this beam lead technology are high, which prevents the package structure from being applicable to mass production. R.O.C. Pat. Pub. No. 506,101, entitled "Stackable flex circuit chip package and method of making the same", disclosed a stackable integrated circuit chip package. This invention consists of a flex circuit, and also, multiple chips are packaged. Although this invention uses a three-dimensional stackable package capable of greatly reducing the entire volume of the package, such an electronic package structure adopts a conductive plastic body to package multiple chip sets. Hence, rework cannot be performed for a single damaged chip under the premise of cost control. R.O.C. Pat. Application No. 200303607, entitled "Stack-type chip semiconductor device", disclosed a three-dimensional stack-type package having electric signals of chips stacked in a three-dimensional manner delivered to a carrier base by a wire bond, the stack chips being stuck together with glue interposed therebetween. Since input/output terminals of the chips on a semiconductor according to the prior ROC patent application do not locate around the chips, it is difficult to achieve a connection by the wire bond.

In the aforesaid electronic package assembly, differences in temperature distribution and coefficient of thermal expansion will cause thermal stresses to be mismatched in the interface area between different materials, and will even possibly cause damage to components as a result of electrode pad breakage or malfunction of a single die as a result of other reasons during the packaging process. As such, the entire package assembly is discarded. This kind of damage relates generally to fatigue rupture which is the primary cause resulting in a damaged electronic package component. It is therefore an important subject for the electronic package to come up with a way of how to extend the life of usage for an electronic component or how to replace a single die in a stack.

In view of the fact that the three-dimensional stack packaging technology will be used for the electronic-structure module of the electronic logic components and the electronic memory components to reduce the costs, minimize the package size and ensure capability of reworking the electronic package, the present invention provides an electronic package structure using a flexible substrate so as to greatly reduce fabrication cost of the stack electronic package and maintain the reliability after long term usage.

Therefore, it is desirable to provide an improved three-dimensional multichip stack electronic package structure to mitigate and/or obviate the aforementioned problems.

SUMMARY OF THE INVENTION

A primary object of the present invention is to provide a three-dimensional multichip stack electronic package structure which uses a flexible substrate for the package. Because the flexible substrate has a smaller elastic coefficient and a smaller thickness than the known organic substrate, the dynamic strength of the flexible substrate is less than that of the organic substrate. Because the strength of the flexible substrate is less than that of the chip, the known adverse effect caused by difference in coefficient of thermal expansion that is mismatched will not generate shearing stresses against the electronic package device under a temperature load. Accordingly, the reliability of the electronic structure after long term usage is improved.

Another object of the present invention is provide a three-dimensional multichip stack electronic packaging method by using a flexible substrate so as to achieve this end, satisfy the market demand from the advanced electronic industry, significantly reduce complexity of wafer fabricating process and greatly reduce product cost. Because the electronic component is mounted on the flexible substrate which is then folded for being assembled to the main substrate, a single damaged chip in the multichip package can be reworked by replacing the flexible substrate with one having an effective electronic component with better performance in transmitting electric signals to be assembled into the multichip package. Hence, this package type will significantly reduce the fabrication cost.

To attain the aforesaid objects, a three-dimensional multichip stack electronic package structure according to the present invention comprises a main substrate having at least a connection unit; a flexible substrate including at least a second face, a third face, at least a conductive wire for transmitting electric signals and at least a pin terminal, wherein the pin terminal corresponds to the connection unit connected to and mounted on the main substrate and the conductive wire for transmitting electric signals is mounted on the second face; and an electronic component having at least a contact pad connected to the second face of the flexible substrate, wherein the conductive wire for transmitting electric signals of the flexible substrate has an end electrically connected to the pin terminal, the contact pad of the electronic component is electrically connected to the conductive wire for transmitting electric signals to deliver electric signals of the electronic component to the pin terminal, and the third face of the flexible substrate adheres to the face of an electronic component of another flexible substrate, the face of the main substrate or the second face of another flexible substrate.

To attain the afore said objects, a three-dimensional multichip stack electronic packaging method according to the present invention comprises the steps of: (a) providing a main substrate having at least a connection unit; (b) providing a flexible substrate including at least a second face, a third face, at least a conductive wire for transmitting electric signals and at least a pin terminal wherein the pin terminal corresponds to the connection unit connected to and mounted on the main substrate, the conductive wire for transmitting electric signals is mounted on the second face and the conductive wire for transmitting electric signals has an end electrically connected to the pin terminal; (c) providing an electronic component having at least a contact pad connected to the second face of the flexible substrate; (d) inserting the pin terminal of the flexible substrate into the connection unit of the main substrate; and (e) adhering the third face of the flexible substrate to the faces of electronic components of another flexible substrate, the face of the main substrate or the second face of another flexible substrate.

An electronic package structure provided by the present invention comprises a main substrate having at least a connection unit disposed on the main substrate or at least a connector. Preferably, the connection unit is constructed by a single or plural pin holes. The connection unit disposed on the main substrate forms a pattern which is preferably in the shape of two parallel lines, two non-parallel lines, a triangle, a polygon, an ellipse or a combination thereof. In addition, the quantity of the flexible substrate can be either single or plural, the flexible substrate having a single or plural pin terminals disposed thereon. The geometric shape and the quantity of the pin terminals correspond to those of the connection unit disposed on the main substrate. Preferably, the pin terminal is disposed on one or more than one sides of the flexible substrate, the face of the flexible substrate or a combination thereof. Moreover, the flexible substrate may include a single or plural pin holes for connection to another flexible substrate.

A single or plural electronic components may comprise an active component and a passive component. The electronic components on the flexible substrates respectively may be identical or different, being attached to the flexible substrate by adhesion. Also, the flexible substrate has a single or plural conductive wires for delivering electric signals of the electric component to the pin terminal. Correspondingly, the quantity of the pin terminals on the respective flexible substrates may be identical or different, depending on the quantity of the electronic components carried by the flexible substrate. Preferably, the electronic component adheres to the flexible substrate by alloy reflow bonding, gluing, pressing or a combination thereof.

Other objects, advantages, and novel features of the invention will become more apparent from the following detailed description when taken in conjunction with the accompanying drawings.

DETAILED DESCRIPTION OF THE PREFERRED EMBODIMENT

Three preferred embodiments of this invention will be described with reference to the accompanying drawings for illustrating the present invention.

Figure 1A:
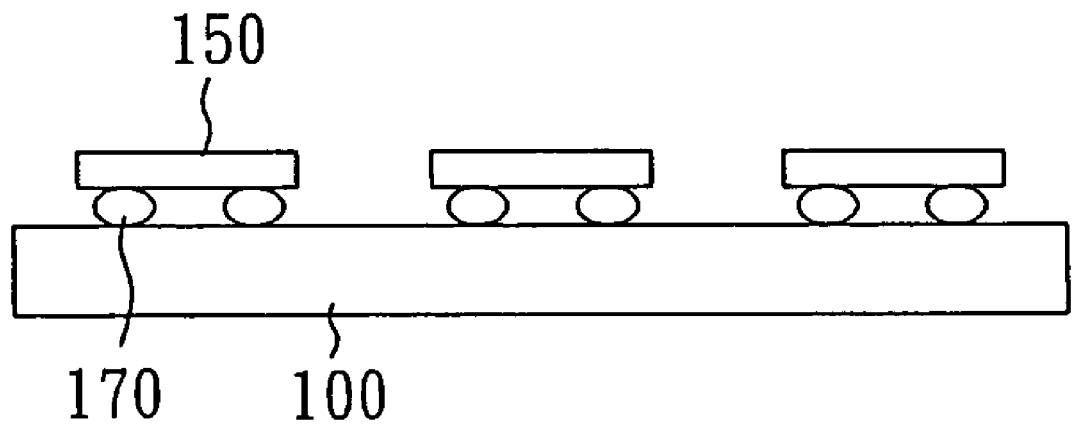
FIGS. 1a and 1b are schematic views of a conventional electronic package structure.
Figure 1B:
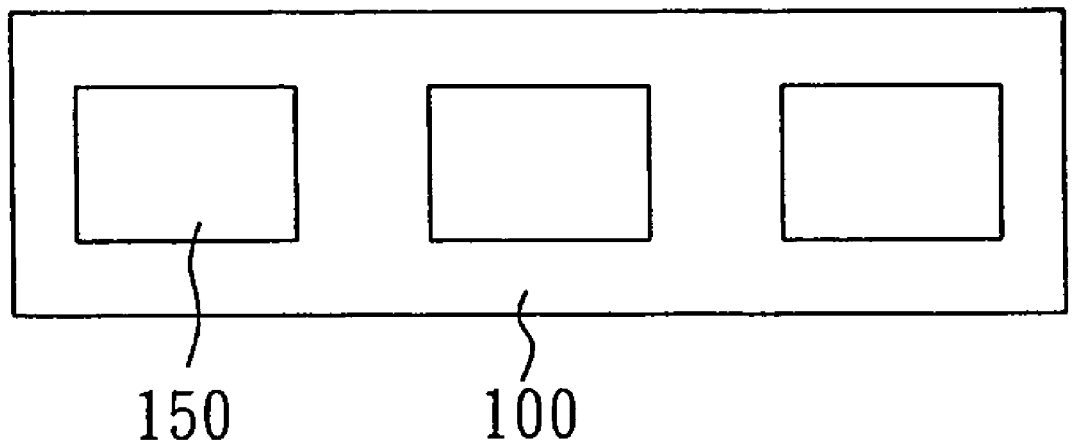
Figure 2A:
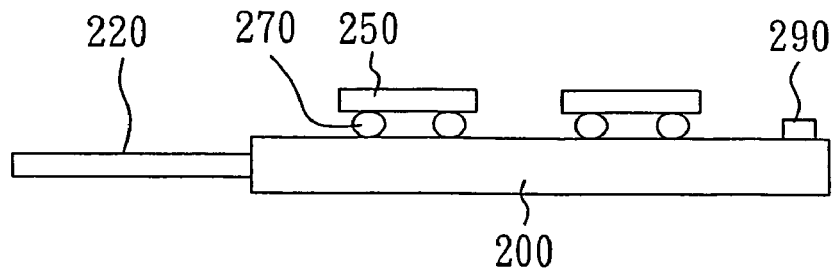
FIGS. 2a through 2f are side views of a structure of a flexible substrate according to the present invention.
Figure 2B:
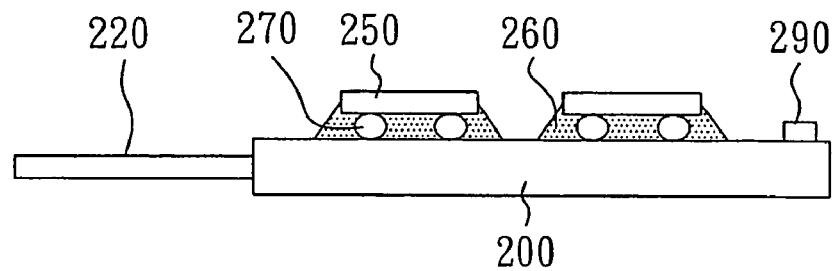
Figure 2C:
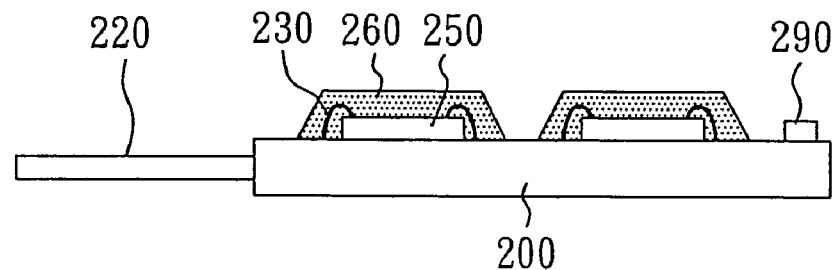
Figure 2D:
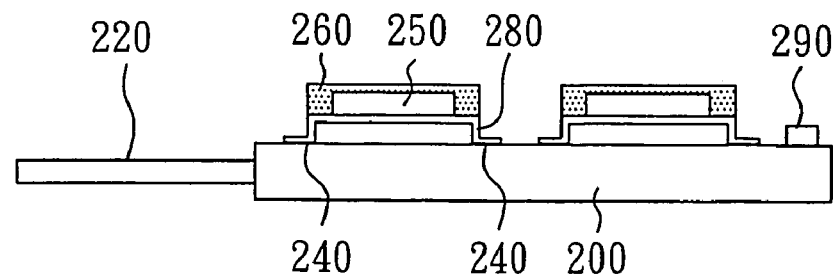
Figure 2F:
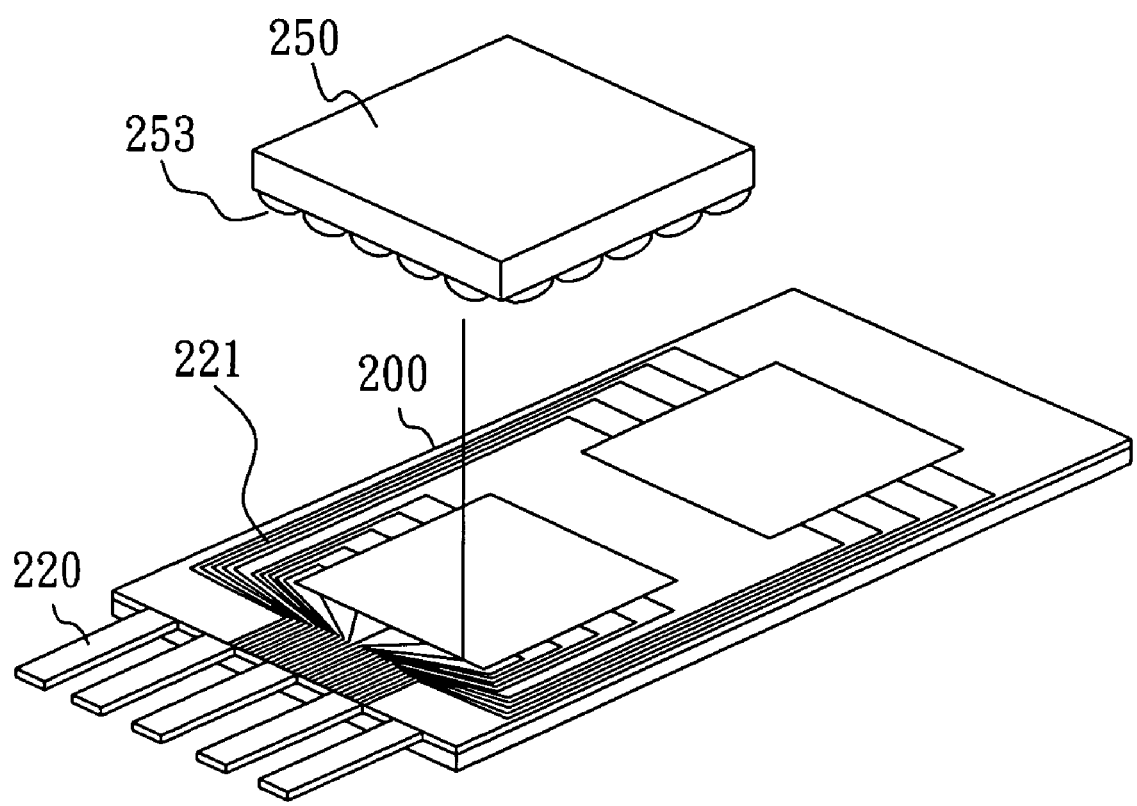
Figure 2E:
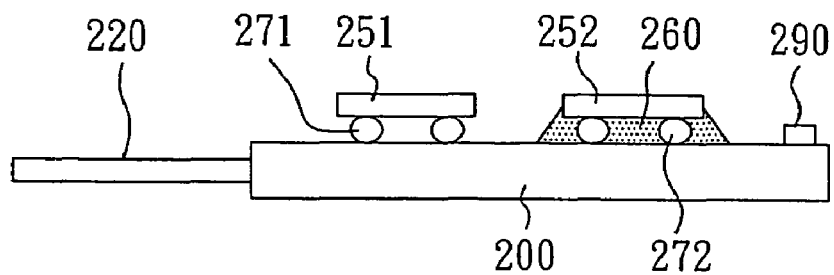
Figure 3:
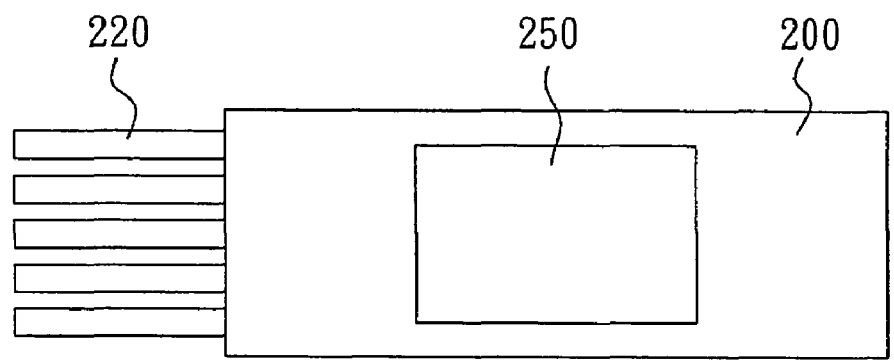
FIG. 3 is a top view of a flexible substrate according to the present invention.

FIGS. 2a through 2f are side views of a structure of a flexible substrate according to the present invention. In FIG. 2a, the flexible substrate 200 has a plurality of pin terminals 220 on one side thereof and a single or plural electronic components 250 attached to the flexible substrate 200 with a fastening structure 270 by high-temperature reflowing technology or surface mount technology. Also, the flexible substrate 200 has a passive component 290 mounted thereon. The material of the fastening structure 270 is selected from a group consisting of tin, tin/copper alloy, tin/indium-tin-oxide alloy, tin/silver alloy, tin/bismuth alloy, tin/lead alloy and a solder ball of conductive pasting compound. In FIG. 2b, the flexible substrate 200 has a plurality of pin terminals 220 on one side thereof and a single or plural electronic components 250 attached to the flexible substrate 200 with a fastening structure 270 by high-temperature reflowing technology or surface mount technology. In addition, filling glue 260 is used to provide the reliability of the structure of the electronic component. Also, the flexible substrate 200 has a passive component 290 mounted thereon. The material of the fastening structure 270 is selected from a group consisting of tin, tin/copper alloy, tin/indium-tin-oxide alloy, tin/silver alloy, tin/bismuth alloy, tin/lead alloy and a solder ball of conductive pasting compound. In FIG. 2c, the flexible substrate 200 has a plurality of pin terminals 220 on one side thereof and a single or plural electronic components 250 having the back face thereof attached to the flexible substrate 200. In addition, electric signals of the electronic component 250 are delivered to the flexible substrate 200 by means of wire bonds 230. Furthermore, filling glue 260 is used to fasten the structure formed of the electronic component 250 and the wire bonds 230. Also, the flexible substrate 200 has a passive component 290 mounted thereon. In FIG. 2d, the flexible substrate 200 has a plurality of pin terminals 220 on one side thereof and a single or plural electronic components 250 which adhere to a lead frame 280 and are encapsulated by filling glue 260. The lead frame 280 is attached to the flexible substrate 200 with an adhesive structure 240 by high-temperature reflowing technology or surface mount technology. Also, the flexible substrate 200 has a passive component 290 mounted thereon. The material of the adhesive structure 240 is selected from a group consisting of tin, tin/copper alloy, tin/indium-tin-oxide alloy, tin/silver alloy, tin/bismuth alloy, tin/lead alloy and a solder ball of conductive pasting compound. In FIG. 2e, multiple electronic components are packaged in different manners. The flexible substrate 200 has a plurality of pin terminals 220 on one side thereof, an electronic component 251 and an electronic component 252, in which the electronic component 251 is attached to the flexible substrate 200 with a fastening structure 271 while the electronic component 252 is attached to the flexible substrate 200 with a fastening structure 272 and filling glue 260. Also, the flexible substrate 200 has a passive component 290 mounted thereon. The material of the fastening structure 271 or the fastening structure 272 is selected from a group consisting of tin, tin/copper alloy, tin/indium-tin-oxide alloy, tin/silver alloy, tin/bismuth alloy, tin/lead alloy and a solder ball of conductive pasting compound. In FIG. 2f, the flexible substrate 200 has a plurality of pin terminals 220 on one side thereof. A conductive wire pattern 221 is mounted on the surface of the flexible substrate 200. An electronic component 250, which has plural contact pads 253, is attached to the flexible substrate 200 by high-temperature reflowing technology or surface mount technology. The material of the contact pads 253 is selected from a group consisting of tin, tin/copper alloy, tin/indium-tin-oxide alloy, tin/silver alloy, tin/bismuth alloy, tin/lead alloy and a solder ball of conductive pasting compound. After attaching the electronic component 250 to the flexible substrate 200, the contact pads 253 of the electronic component 250 are electrically connected to the conductive wire pattern 221 of the flexible substrate 200, while the conductive wire pattern 221 of the flexible substrate 200 is electrically connected to the pin terminals 220. As a result, the electric signal can be transmitted between the electronic component 250 and the main substrate with which the flexible substrate 200 is connected. FIG. 3 is a top view of a flexible substrate according to the present invention. There is a flexible substrate 200, and an electronic component 250 connected to the flexible substrate 200 by said connecting manner. In addition to an electric circuit pattern (not shown) disposed on the flexible substrate 200, there is a plurality of pin terminals 220 so that the electronic component 250 is connected to an external object through said electric circuit pattern and pin terminals 220. The material of the pin terminals is selected from a group consisting of copper, copper alloy, gold, silver, palladium, platinum, aluminum/gold alloy, aluminum/palladium alloy, nickel/gold alloy, nickel/palladium alloy and a combination thereof.

Figure 4A:
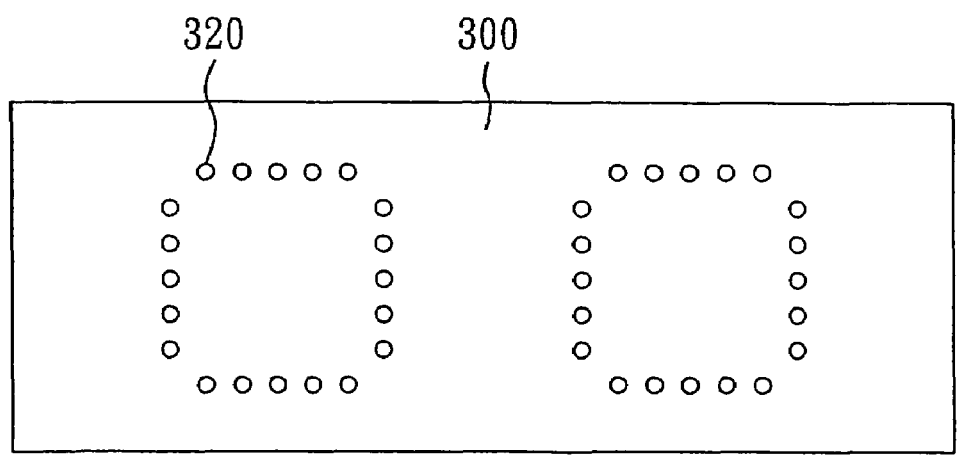
FIGS. 4a through 4c are top views of disposition of pin holes or connectors on a main substrate according to the present invention.
Figure 4B:
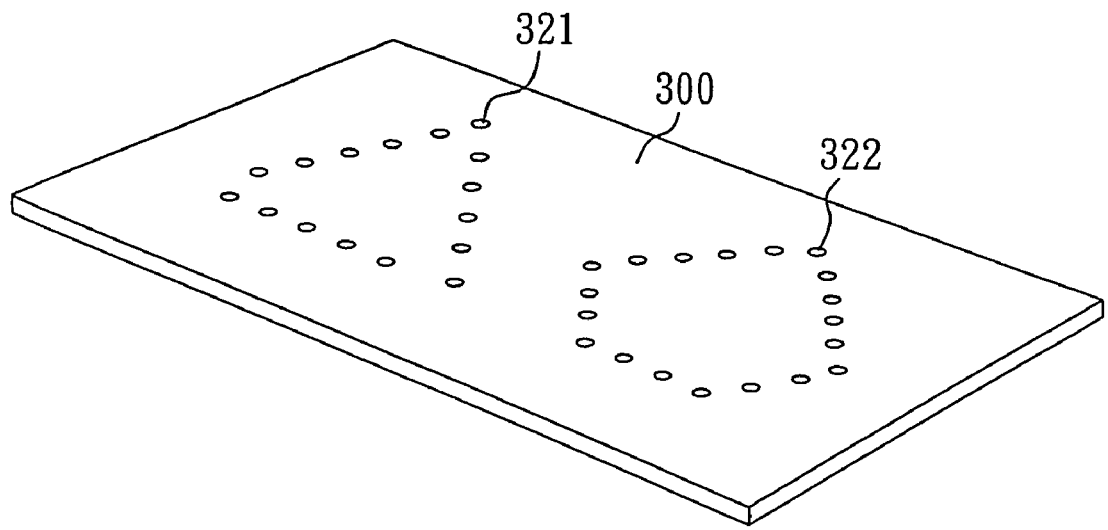
Figure 4C:
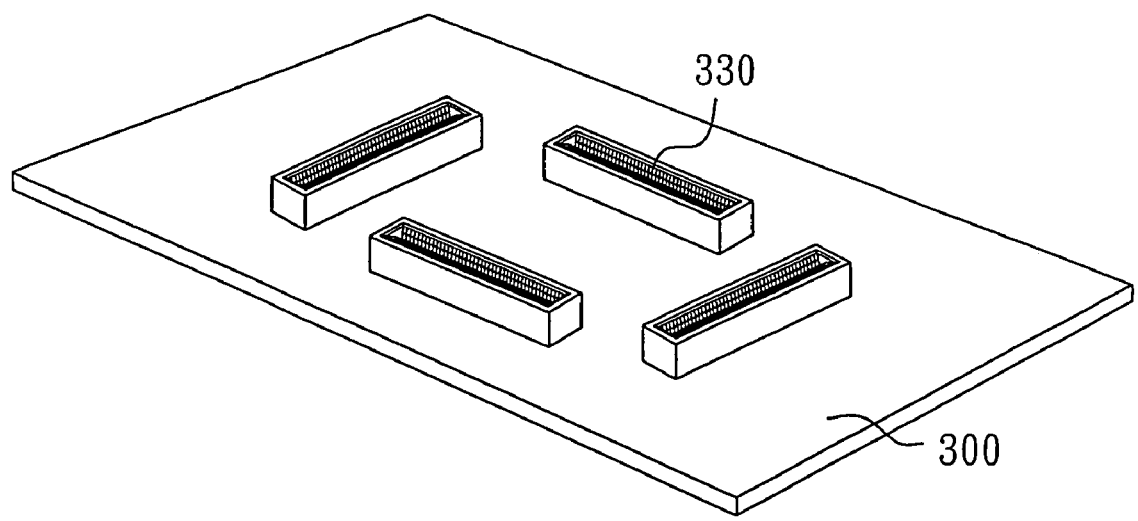

FIGS. 4a through 4c are disposing patterns of those pin holes or connectors on a main substrate according to the present invention. As shown in FIG. 4a, there is a main substrate 300 on which a plurality of pin holes 320 are disposed in the shape of a quadrangle. As shown in FIG. 4b, a plurality of pin holes 321 is disposed in the shape of a triangle on the main substrate 300. Also, a plurality of pin holes 322 is disposed in the shape of a pentagon on the main substrate 300. In FIG. 4c, another form of the main substrate is disclosed, using a connector 300 for connection to the flexible substrate.

In assembly, the pin terminals of the flexible substrate are inserted into the pin holes of the main substrate. Then, the flexible substrate is folded so that the electronic components are assembled in a three-dimensional multichip stack manner. The flexible substrate being assembled to the main substrate can be folded a number of times, either odd or even times, without limitation, depending on the pattern formed by the pin holes or connectors disposed on the main substrate. Hence, the size of the flexible substrate is not subject to the area circumscribed by the pin holes or connectors. In some cases, the flexible substrate is not even folded, but is directly adhered to another flexible substrate.

Embodiment 1

In this embodiment, an electronic package structure stacked in one-way direction is disclosed. FIG. 4a is a top view of the structure of a main substrate according to this embodiment. There is a main substrate 300 and a plurality of pin holes 320 disposed in the shaped of a quadrangle on the main substrate 300, the pin holes 320 so disposed correspondingly geometrically to the pin terminal 220 shown in FIG. 3.

Figure 5A:
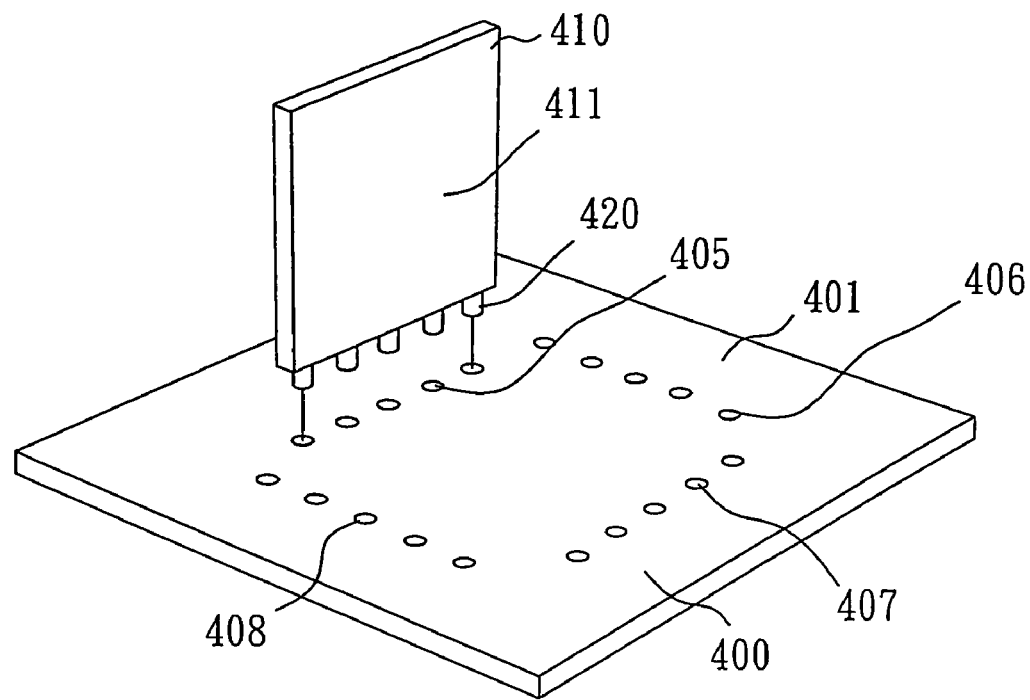
FIGS. 5a through 5d schematically shows flexible substrates respectively assembled to a main substrate having pin holes disposed in the shape of a quadrangle, in sequence, according to a preferred embodiment of the present invention.
Figure 5B:
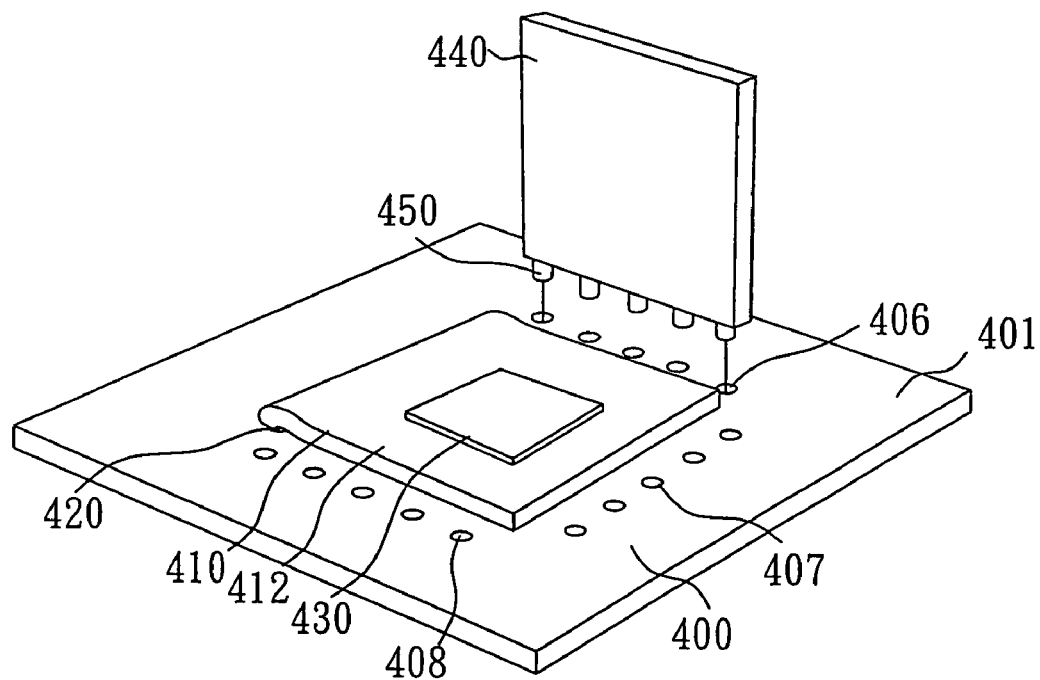
Figure 5C:
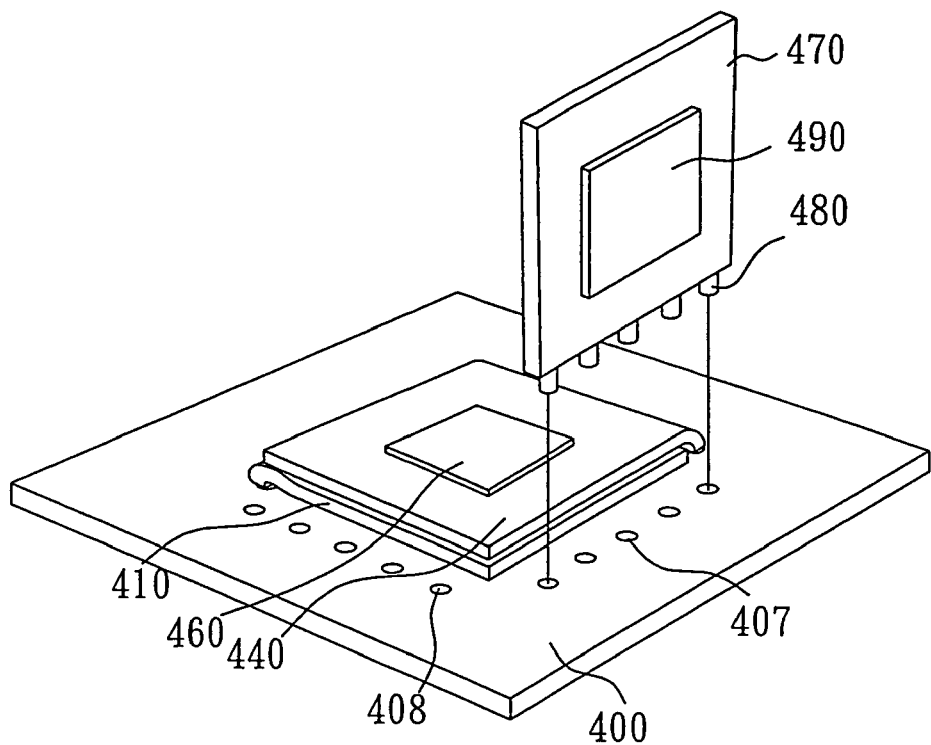
Figure 5D:
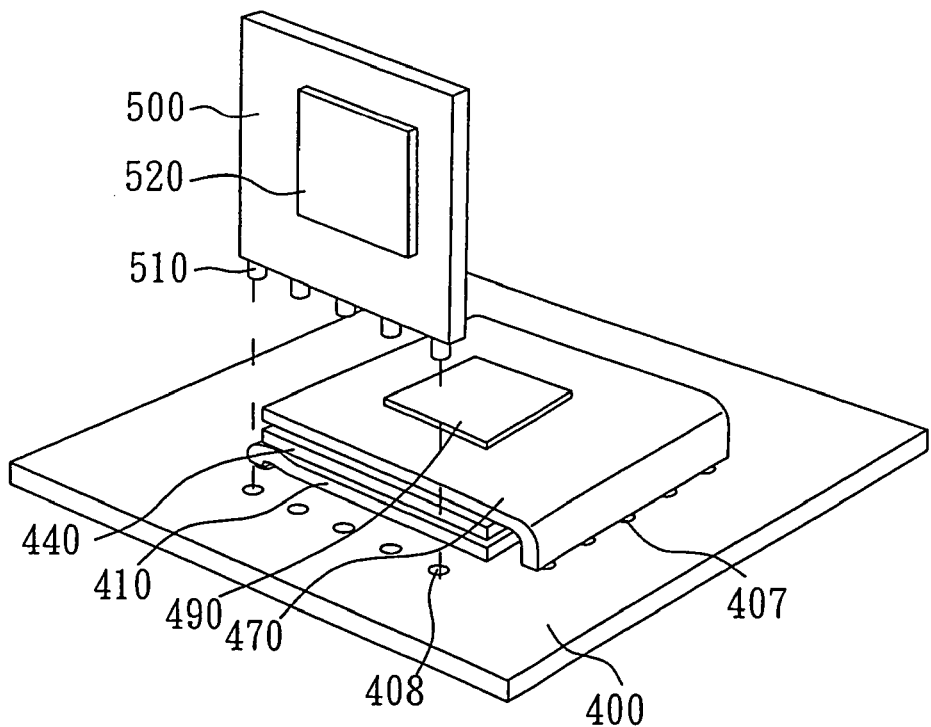

FIGS. 5a, 5b, 5c and 5d schematically show flexible substrates respectively assembled to a main substrate having a plurality of pin holes disposed in the shape of a quadrangle, in sequence, according to this embodiment. A main substrate 400 has a plurality of pin holes 405, 406, 407 and 408 on the upper face thereof. FIG. 5a is a schematic view of a first flexible substrate 410 assembled to the main substrate 400. The first flexible substrate 410 has a second face 412 on which an electronic component 430 (shown in FIG. 5b) is mounted, having a plurality of pin terminals 420 corresponding to the pin holes 405 on the main substrate 400. In assembly, the pin terminals 420 are aligned with the pin holes 405 in the main substrate 400 for insertion. Then, the first flexible substrate 410 is folded so that a third face 411 of the first flexible substrate 410 adheres to a first face 401 of the main substrate 400. FIG. 5b shows a second flexible substrate 440 having an electronic component 460 (shown in FIG. 5c) mounted thereon, in addition to a schematic view illustrating the structure of the folded flexible substrate 410. The second flexible substrate 440 has a plurality of pin terminals 450 corresponding to the pin holes 406 on the main substrate 400. In assembly, the pin terminals 450 are aligned with the pin holes 406 on the main substrate 400 for insertion. Then, the second flexible substrate 410 is folded so as to adhere to the top face of the first flexible substrate 410. FIG. 5c shows a third flexible substrate 470 having an electronic component 490 mounted thereon, in addition to a schematic view illustrating the structure of the first folded flexible substrate 410 and the second folded flexible substrate 440. The third flexible substrate 470 has a plurality of pin terminals 480 corresponding to the pin holes 408 in the main substrate 400. In assembly, the pin terminals 422 are aligned with the pin holes 427 in the main substrate 405 for insertion. Then, the third flexible substrate 402 is folded so as to adhere to the top face of the second flexible substrate 440. FIG. 5d shows a fourth flexible substrate 500 having an electronic component 520 mounted thereon, in addition to a schematic view illustrating the structure of the first folded flexible substrate 410, the second folded flexible substrate 440 and the third folded flexible substrate 470. The fourth flexible substrate 500 has a plurality of pin terminals 510 corresponding to the pin holes 408 on the main substrate 400. In assembly, the pin terminals 510 are aligned with the pin holes 408 in the main substrate 400 for insertion. Then, the fourth flexible substrate 500 is folded so as to adhere to the top face of the third flexible substrate 470.

Figure 6:
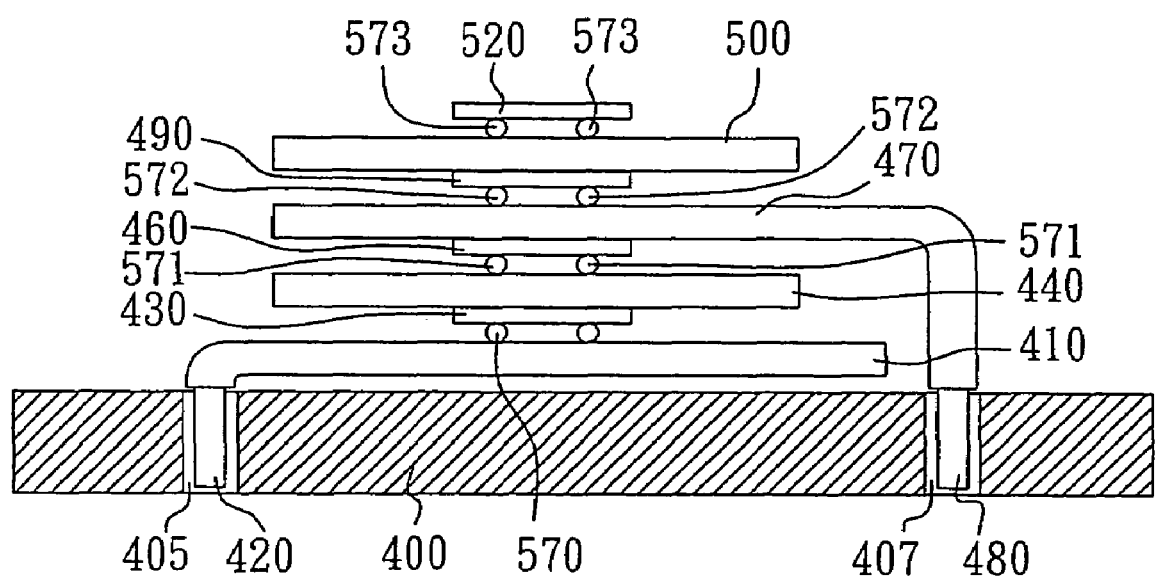
FIG. 6 is a cross-sectional view of flexible substrates respectively assembled to a main substrate having pin holes disposed in the shape of a quadrangle according to the present invention.

FIG. 6 is a cross-sectional view of flexible substrates respectively assembled to a main substrate having pin holes disposed in the shape of a quadrangle according to the present invention. The main substrate 400 has a plurality of pin holes 405, 406, 407 and 408 defined therein. The first flexible substrate 410 and the third flexible substrate 470 are attached to the main substrate 400 by connecting the pin terminals 450, 480 to the pin holes 405, 407. A plurality of electronic components is mounted on the flexible substrates, in which the electronic component 430 is mounted on the first flexible substrate 410, the electronic component 460 is mounted on the second flexible substrate 440, the electronic component 490 is mounted on the third flexible substrate 470 and the electronic component 520 is mounted on the fourth flexible substrate 500. These electronic components are attached to the flexible substrates 410, 440, 470 and 500 with fastening structures 570, 571, 572 and 573 by surface mount technology such as high-temperature reflow or glue. These flexible substrates are folded so that the electronic components are assembled and packaged in a three-dimensional stack manner. In this embodiment, the structural strength of the flexible substrate is less than that of the chip. Hence, the thermal expansion effect will not cause large shearing stresses against the electronic package device under a temperature load. The reliability of the electronic structure after long term usage is high, moreover, no filling glue is used for encapsulating all the electronic components in such a three-dimensional multichip stack electronic package. As a result, heat dissipation of the electronic package, as a whole, is very good.

In addition, a single damaged chip in the multichip package can be reworked by replacing the flexible substrate with one having an effective electronic component with better performance in transmitting electric signals to be assembled into the multichip package. The flexible substrates are fastened with respect to each other by adhesion. Unlike the adhesion used for protecting conducting wires for transmitting electric signals of the electronic component in the conventional package, the adhesion of the present invention is used only for fastening. Hence, the melting point of the adhesion according to the present invention is conveniently low. Also, the pin terminals of the present invention are easy to be inserted into or removed from the connection unit. If a single damaged electronic component is found after the packaging process is completed, only the flexible substrate having that damaged electronic component is removed by warming up the entire electronic package structure.

Embodiment 2

Figure 7:
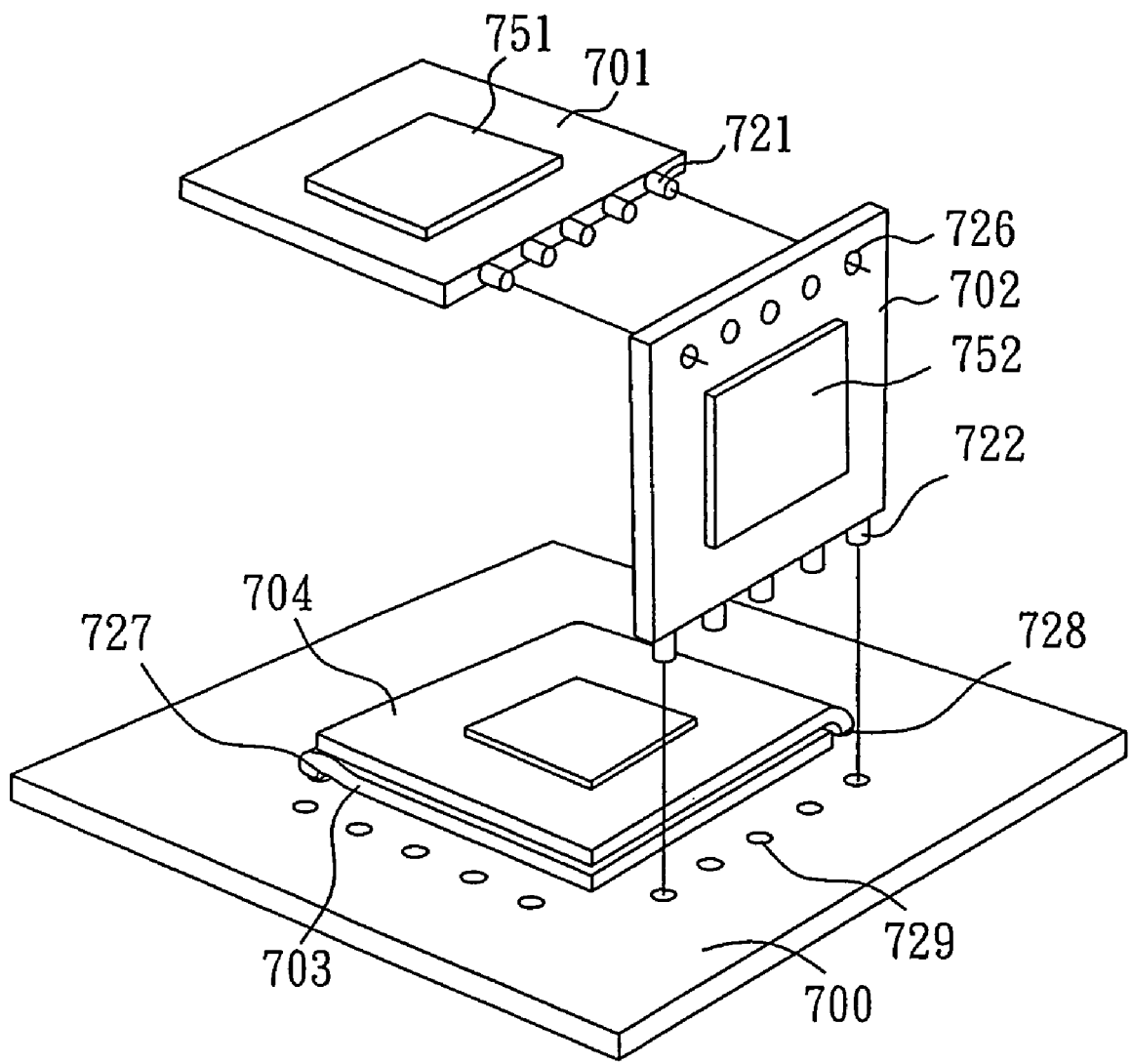
FIG. 7 is a schematic view of flexible substrates, each of which has a plurality of pin holes, respectively assembled to a main substrate having the flexible substrate according to a preferred embodiment of the present invention.

In this embodiment, one of the flexible substrates has a plurality of pin holes for being assembled to a main substrate as shown in FIG. 7. Flexible substrates 703 and 704 are attached to the main substrate 700 by means of pin holes 727 and 728. A fourth flexible substrate 701 has an electronic component 751 mounted thereon, having pin terminals 721 on a side thereof. A third flexible substrate 702 has a plurality of pin holes 726, an electronic component 752 and pin terminals 722 on a side thereof. In assembly, the fourth flexible substrate is attached to the third flexible substrate 702 by means of the pin terminals 721 and the pin holes 726 at first. Also, the third flexible substrate 702 is attached to a main substrate 705 by means of the pin terminals 722 and pin holes 729 defined in the main substrate 705. In addition to the advantages of embodiment one, this embodiment will greatly increase the density of the electronic components on the main substrate because the pin holes of the flexible substrate are disposed for connection to the another flexible substrate to form a structure stacked more than the four-layered structure of the flexible substrates having electronic components, despite the pin holes disposed in the shape of a quadrangle on the main substrate.

Embodiment 3

Figure 8:
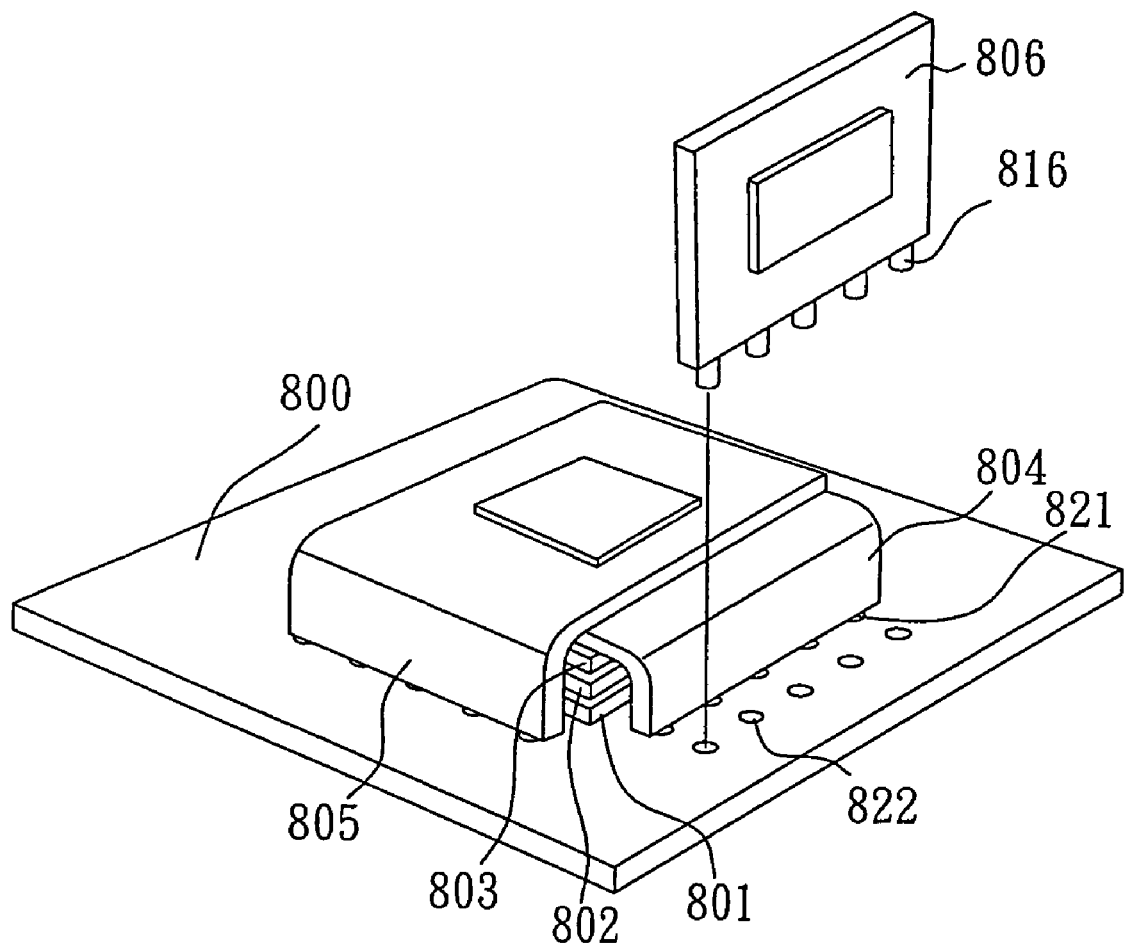
FIG. 8 is a schematic view of flexible substrates respectively assembled to a main substrate according to another preferred embodiment of the present invention.

As shown in FIG. 8, this embodiment provides a main substrate 800 having pin holes 821 disposed in the shape of a quadrangle and pin holes 822 disposed in the shape of a line for assembling the flexible substrates. Flexible substrates 801 to 805 are stacked above the pin holes 821 disposed in the shape of a quadrangle in accordance with the manner of embodiment two, in which each of the flexible substrates 801, 803, 804 and 805 has an electronic component mounted thereon and pin terminals on a side thereof while the flexible substrate 802 has an electronic component, pin terminals and a plurality of pin holes for connecting to the flexible substrate 803. In addition, the flexible substrate 802 is attached to the main substrate 800 by means of pin terminals 816 and pin holes 822. Also, a flexible substrate 806 can be attached to the flexible substrate 804 stacked at the left-hand side thereof so as to fasten the flexible substrate 806 without the need of folding the flexible substrate 806.

Consequently, in this embodiment, the multichip electronic package structure is stacked three-dimensionally, instead of one-dimensionally, to greatly increase the density of the electronic components per unit area.

The present invention intends to cover various modifications and similar arrangements obvious to a person skilled in this art. The scope of the claims, therefore, should be accorded the broadest interpretation so as to encompass all such modifications and similar arrangements.

What is claimed is:

1. A three-dimensional multichip stack electronic package structure, comprising:
   a main substrate having at least a connection unit;
   a flexible substrate including at least a second face, a third face, at least a conductive wire for transmitting electric signals, at least a set of pin holes for connection to the pin terminal of another flexible substrate and at least a pin terminal, wherein said pin terminal corresponds to said connection unit connected to and mounted on said main substrate, and said conductive wire for transmitting electric signals is mounted on said second face; and
   an electronic component having at least a contact pad connected to said second face of said flexible substrate;
   wherein said conductive wire for transmitting electric signals of said flexible substrate has an end electrically connected to said pin terminal, said contact pad of said electronic component is electrically connected to said conductive wire for transmitting electric signals to deliver electric signals of said electronic component to said pin terminal, and said third face of said flexible substrate adheres to the face of an electronic component of another flexible substrate, the face of said main substrate, or said second face of said another flexible substrate.

2. A three-dimensional multichip stack electronic packaging method, comprising the steps of:
   (a) providing a main substrate having at least a connection unit;
   (b) providing a flexible substrate including at least a second face, a third face, at least a conductive wire for transmitting electric signals, at least a set of pin holes for connection to the pin terminals of another flexible substrate and at least a pin terminal wherein said pin terminal corresponds to said connection unit connected to and mounted on said main substrate, said conductive wire for transmitting electric signals is mounted on said second face and said conductive wire for transmitting electric signals has an end electrically connected to said pin terminal;
   (c) providing an electronic component having at least a contact pad connected to said second face of said flexible substrate;
   (d) inserting said pin terminal of said flexible substrate into said connection unit of said main substrate; and
   (e) adhering said third face of said flexible substrate to the faces of electronic components of another flexible substrate, the face of said main substrate or said second face of said another flexible substrate.

* * * * *